US010504737B2

(12) United States Patent
Liao et al.

(10) Patent No.: US 10,504,737 B2
(45) Date of Patent: Dec. 10, 2019

(54) METHODS OF ENHANCING SURFACE TOPOGRAPHY ON A SUBSTRATE FOR INSPECTION

(71) Applicant: Taiwan Semiconductor Manufacturing Co., Ltd., Hsinchu (TW)

(72) Inventors: Han-Wen Liao, Taichung (TW); Jun Xiu Liu, Taichung (TW); Chun-Chih Lin, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/686,995

(22) Filed: Aug. 25, 2017

(65) Prior Publication Data

US 2018/0350614 A1    Dec. 6, 2018

Related U.S. Application Data

(60) Provisional application No. 62/512,572, filed on May 30, 2017.

(51) Int. Cl.
| | |
|---|---|
| *H01L 21/306* | (2006.01) |
| *H01L 21/76* | (2006.01) |
| *H01L 21/67* | (2006.01) |
| *H01L 21/762* | (2006.01) |
| *H01L 21/3105* | (2006.01) |
| *H01L 21/66* | (2006.01) |
| *H01L 21/311* | (2006.01) |

(52) U.S. Cl.
CPC .. *H01L 21/30625* (2013.01); *H01L 21/31053* (2013.01); *H01L 21/67288* (2013.01); *H01L 21/76* (2013.01); *H01L 21/76224* (2013.01); *H01L 22/12* (2013.01); *H01L 22/20* (2013.01); *H01L 22/24* (2013.01); *H01L 21/30608* (2013.01); *H01L 21/31111* (2013.01)

(58) Field of Classification Search
CPC ............... H01L 21/30625; H01L 21/76; H01L 21/67288; H01L 21/3063
USPC .................. 438/692, 753; 216/59, 60, 84, 85
See application file for complete search history.

(56) References Cited

U.S. PATENT DOCUMENTS

| | | | | |
|---|---|---|---|---|
| 5,766,976 A | * | 6/1998 | Majima | .................. C30B 29/06 |
| | | | | 216/84 |
| 2002/0042154 A1 | * | 4/2002 | Nakabayashi | .......... H01L 22/12 |
| | | | | 438/14 |
| 2016/0163802 A1 | * | 6/2016 | Glass | ..................... H01L 29/78 |
| | | | | 257/76 |

* cited by examiner

*Primary Examiner* — Binh X Tran
(74) *Attorney, Agent, or Firm* — Seed IP Law Group LLP

(57) ABSTRACT

Methods for enhancing a surface topography of a structure formed on a substrate are provided. In one example, the method includes performing a polishing process on a substrate having a shallow trench isolation structure and a diffusion region, performing a surface topography enhancing process to enlarge a defect in at least one of the shallow trench isolation structure and the diffusion region, inspecting at least one of the shallow trench isolation structure and the diffusion region to detect the enlarged defect, and adjusting a parameter of the polishing process in response to detecting the enlarged defect.

20 Claims, 5 Drawing Sheets

METHODS OF ENHANCING SURFACE TOPOGRAPHY ON A SUBSTRATE FOR INSPECTION

CROSS-REFERENCE TO RELATED APPLICATIONS

This application claims benefit of U.S. Provisional Application Ser. No. 62/512,572 filed May 30, 2017, which is incorporated by reference in its entirety.

BACKGROUND

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

As the geometry limits of the structures used to form semiconductor devices are pushed against technology limits, the need to form structures having small critical dimensions and high aspect ratios with different materials has become increasingly difficult to achieve. Chemical mechanical planarization, or chemical mechanical polishing (CMP) is a common technique which is useful in removing undesired surface topography, or in forming features on a substrate by removing excess deposited material used to fill the features and to provide an even or level surface for subsequent deposition and processing. During a CMP process, relative motion is provided between the substrate and polishing surface of a polishing pad to planarize the surface of the substrate in contact with the pad through one or a combination of a chemical, mechanical, or electrochemical process. However, mechanical abrasion during the CMP process may also result in undesired micro-scratches, dishing, residuals or other undesired defects on the structures of the substrate.

There is, therefore, a need to solve the issues associated with the above deficiencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2D$_3$ depict cross sectional views of a substrate with composite structures at different stages of the manufacturing process depicted in FIG. 1 in accordance with some embodiments;

DETAILED DESCRIPTION

Figure 1:
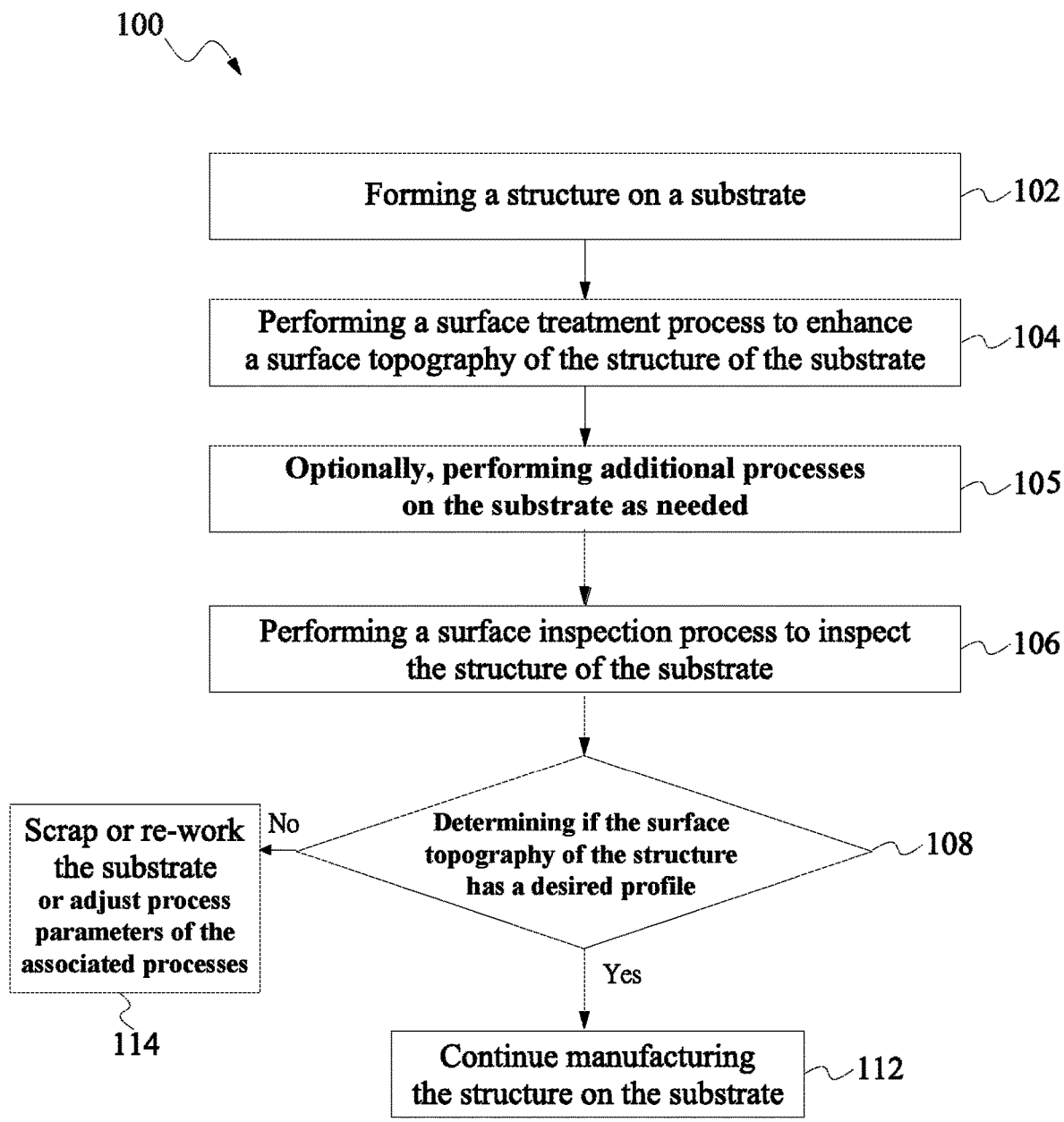
FIG. 1 is a flow diagram of an exemplary process for manufacturing a substrate structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow diagram of a process 100 performed to enhance a surface topography of a structure formed on a substrate so the enhanced surface topography could be detectable by a subsequent inspection process in accordance with some embodiments. The structure formed on the substrate may be any suitable structures formed on a semiconductor substrate, such as a shallow trench isolation (STI) structure with diffusion regions (e.g., active regions) formed therebetween, interconnection structure with conductive and non-conductive areas, a fin structure formed around shallow trench isolation structure (e.g., a FINFET structure), a gate structure, a contact structure, a front-end structure, a back-end structure or any other suitable structures utilized in semiconductor applications.

FIGS. 2A-2D$_3$ are schematic cross-sectional views of a portion of the substrate corresponding to various stages of the process 100 in accordance with some embodiments. The process 100 begins at operation 102 by forming a structure 250 on a substrate, such as the substrate 200 in FIG. 2A as shown. In one example, the structure 250 is utilized in a front-end isolation structure that may be later utilized to have a gate structure formed thereon. In the example depicted in FIG. 2A, the structure 250 includes shallow trench isolation structures 202 formed between diffusion regions 205 (e.g., active regions). A protection layer 208 is formed on the diffusion region 205. The diffusion region 205 has a width 204 sufficient to allow at least a gate structure with different types of active dopants to be doped therein in the substrate 200.

Exemplary materials for the substrate 200 include materials selected from at least one of crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass and sapphire. In the embodiment wherein a SOI structure is utilized for the substrate 200, the substrate 200 may include a buried dielectric layer disposed on a silicon crystalline substrate. In the embodiments depicted herein, the substrate 200 is a silicon containing material, such as crystalline silicon substrate. Moreover, the substrate 200 is not limited to any particular size, shape or materials. The substrate 200 may be a round/circular substrate having a 200 mm diameter, a 300 mm diameter or other diameters, such as 450 mm, among others. The substrate 200 may also be any polygonal, square, rectangular, curved or otherwise non-circular workpiece, such as a polygonal glass substrate as needed.

In one example, the protection layer 208 is manufactured from a material different from the material for the shallow trench isolation structures 202. The material selected for the shallow trench isolation structures 202 is etched or polished with high etching or polishing selectivity to the material selected from the protection layer 208 during an etching process or a chemical mechanical polishing (CMP) process. The high etching or polishing selectivity during the etching process or the chemical mechanical polishing (CMP) process provides a good etching or polishing stop point during the process so as to have a better end-pint control to prevent the structure 250 of the substrate 200 from damage during processing. The protection layer 208 also helps to protect the structures or materials disposed thereunder from damage during the etching process or the chemical mechanical polishing (CMP) process. The protection layer 208 is first formed as a blanket layer across the substrate 200 and later patterned to form desired features on the substrate 200. The protection layer 208 may be formed by suitable deposition processes, such as plasma enhanced chemical vapor deposition, flowable chemical vapor deposition, high density plasma chemical vapor deposition process, atomic layer deposition, or cyclical layer deposition. Suitable materials for the protection layer 208 include silicon nitride, silicon oxynitride, silicon oxycarbide, and other suitable doped nitride or carbon containing materials.

In one example, the shallow trench isolation structures 202 are formed in the substrate 200 by etching a predetermined location in the substrate 200 and the protection layer 218 to form a trench. Then, an insulating material or a dielectric material fills the trench to form the shallow trench isolation structures 202. In one example, the insulating material or the dielectric material is deposited in the shallow trench isolation structures 202 using a suitable deposition process, such as a plasma enhanced chemical vapor deposition, a flowable chemical vapor deposition, a high density plasma chemical vapor deposition process, atomic layer deposition, or cyclical layer deposition. The shallow trench isolation structures 202 are formed of an insulating material or a dielectric material, such as an oxide containing material, silicon oxide material, silicon nitride material or silicon carbon nitride material. The materials for the shallow trench isolation structures 202 may be one or more layers. In one example, the shallow trench isolation structure 202 is formed from a dielectric material. In one specific example, the shallow trench isolation structure 202 is formed from one or more layers of dielectric materials, such as silicon oxide ($SiO_2$), and the protection layer 208 is formed from one or more layers of dielectric materials, such as silicon nitride (SiN).

Figure 2A:
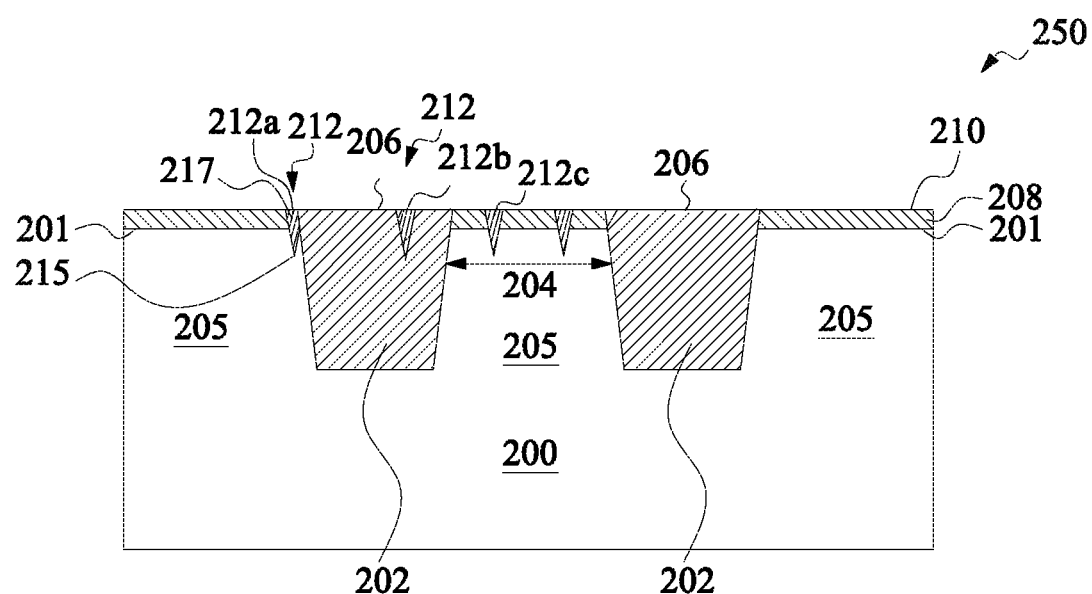

During manufacturing, a chemical mechanical polishing (CMP) process is performed to remove excess materials over the shallow trench isolation structure 202, forming a top surface 206 that is substantially coplanar to a top surface 210 of the protection layer 208, as shown in FIG. 2A. After the chemical mechanical polishing (CMP) process, some defects 212 (also shown as 212a, 212a', 212a", 212b, 212c in FIGS. 2A-2D₃), may form in the shallow trench isolation structure 202 as well as in or on the protection layer 208 and the diffusion region 205. It is noted that the defects 212 referred here can be microstructures, such as micro-scratches, convex regions, concave regions, dishing, or erosion. For example, the defects 212 has an upper portion 217 exposed on the substrate 200 and a first tip portion 215 projecting downward into the diffusion region 205.

Figure 2B:
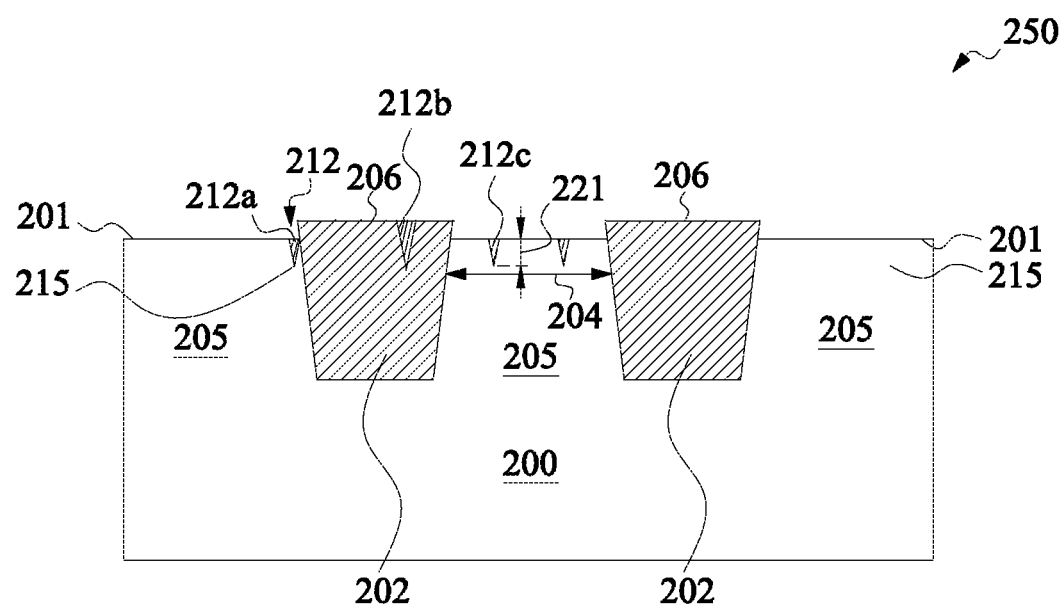

Subsequently, after the protection layer 208 is removed from the substrate 200, the upper portion 217 of the defects 212a, 212c in the protection layer 208 may be removed, leaving the first tip portion 215 of the defect 212c in the diffusion region 205 or the first top portion 215 of the defect 212a at the interface between the shallow trench isolation structure 202 and the diffusion region 205, as shown in FIG. 2B. In this example, the first tip portion 215 of the defects 212a, 212c has a first height 221 remaining in the diffusion region 205.

Defects 212 remaining on the substrate 200, e.g., mostly in the diffusion regions 205, may be too subtle or too shallow to be detected by a defect inspection tool, at this manufacturing stage. Suitable defect inspection tools include optical or electronic beam microscopes and the like. Undetected defects may later result in structure collapse or structure peeling in the subsequent manufacturing steps. Structure collapse, deformation, or peeling would result in electrical leakage at the flawed spots, thus eventually resulting in electrical breakdown and device failure, inoperable and low product yield.

Figure 2C:
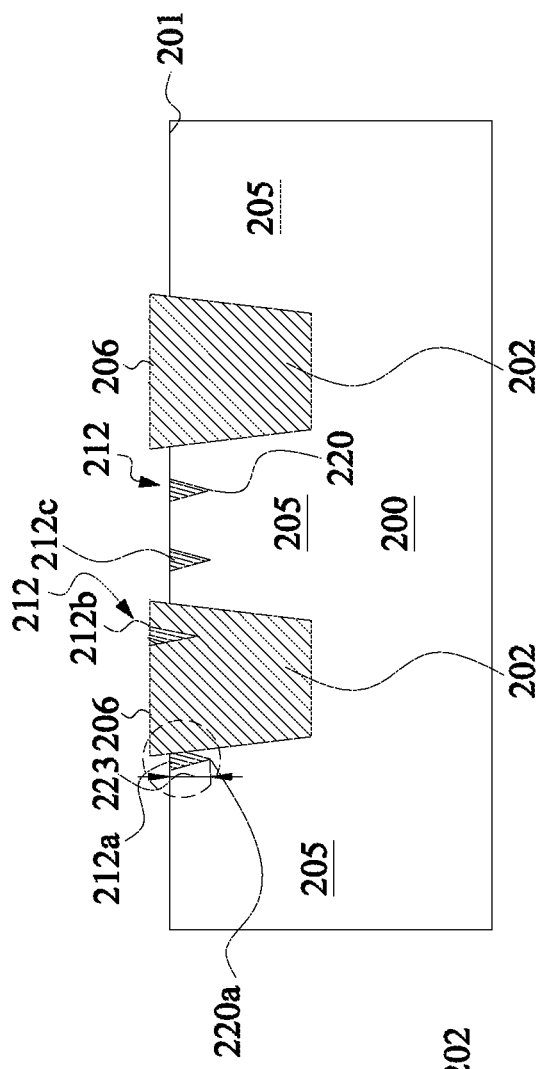
Figure 2C:
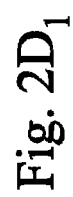
Figure 2C:
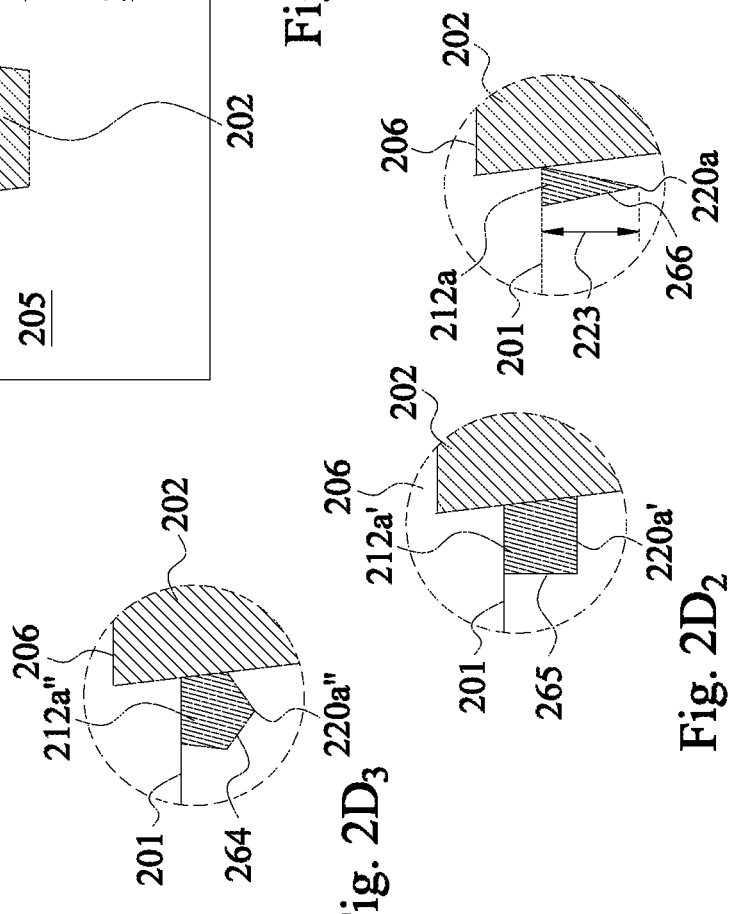

At operation 104, a surface topography enhancing process is performed on the surfaces 206, 201 of the STI structure 202 and the diffusion regions 205 in the substrate 200, as shown in FIG. 2C. The surface topography enhancing process is a surface treatment process that globally or locally alters the surface profiles of a structure on a substrate. The surface treatment process provides reactive species to react with materials from the STI structure 202, the diffusion regions 205, or both, so as to enhance the detectability of one or more defects 212. Examples of enhancing the defects 212 include enlarging or deepening the defect. As a result, the defects 212 with the enhanced conditions become detectable and in some cases more measurable by a defect inspection tool. In the example shown in FIG. 2C, the defects 212 on the substrate 200 are enlarged to have a tip portion 220 having a second height 223. The second height 223 is greater than the first height 221 of the first tip portion 215. In one example, the second height 223 is between about 20 percent and about 60 percent greater than the first height 221 of the first tip portion 215. The second height 223 of the enlarged defect 212 has a depth of between about 800 Å and about 1600 Å. In another example, a defect 212 is enlarged by widening its upper portion, either with or without lengthening or deepening the defect. Similarly, the defect 212 is enlarged in width greater than about 20 percent and about 60 percent than its original width.

In one example, the surface treatment process is a wet process performed by immersing, or soaking the substrate 200 with or in a treatment solution. In another example, a dry process, such as a vapor or a plasma process, is utilized to react with the surfaces 206, 201 of the STI structure 202 and the diffusion regions 205 in the substrate 200. In yet another example, a combination of wet and dry process is utilized to react with the surfaces 206, 201 of the STI structure 202 and the diffusion regions 205 in the substrate 200. In one specific example, the surface treatment process performed at operation 104 is a wet process performed by dipping, immersing, or soaking the substrate with or in a treatment solution in a wet tank. The treatment solution may be an alkaline, neutral or acid solution with a pH value in a predetermined range. Selection of the treatment solution is based on the material types and the locations along with the surrounding materials where the defects 212 is formed or to be enhanced.

In another specific example, the surface treatment process performed at operation 104 is a dry process. The dry process involves positioning the substrate in a processing chamber and treating the surface of the substrate using a plasma. The plasma is formed by an etching gas mixture. In one example, the etching gas mixture includes at least one halogen containing gas. Suitable examples of the halogen containing gas include HBr, $CF_4$, $CHF_3$, HCl, $Cl_2$, $CH_2F_2$, $C_2F_6$, $C_2F_8$, $C_4F_6$, $SF_6$, $NF_3$, and the like. In one example, HBr (with or without $Cl_2$) is included in the etching gas mixture. Some halogen containing gases having a carbon element may also be utilized in the etching gas mixture. Exemplary halogen containing gases having a carbon element (e.g., a carbon and halogen containing gas) include $CF_4$, $CHF_3$, $CH_2F_2$, $C_2F_6$, $C_2F_8$, $C_4F_6$ and the like.

For example, in the embodiment where the defect 212b is formed on an STI structure 202, which is fabricated from one or more insulating material or dielectric material, the treatment solution may be an acid solution that reacts with the materials from the STI region 202. The acid solution etches the insulating material, e.g., a silicon oxide material, of the STI region 202. The acid solution may include etchants having fluorine based chemicals, such as HF, buffered HF (BOE), ammonium fluoride, or ammonium bifluoride, dissolved in deionized water. Buffering compounds may be added to provide different pH levels for a given concentration. Some buffering compounds, such as one or more pH adjusting agents, surfactant, additives or solvents, may be utilized to maintain a desired level of pH value and/or to assist dissociation of the chemical compounds dissolved in the treatment solution. Suitable examples of the solvents include ethylene glycol, toluene, pyridine and the like. In some examples, an oxidizer, such as $HNO_3$, $H_2O_2$ and the like, is utilized to assist with the chemical reaction in the acid solution.

In one specific example, the acid solution for the surface treatment process contains at least one fluorine containing chemical having a concentration of between about 0.1 volumetric percent (%) and about 35 volumetric percent (%) in deionized water. Suitable examples of the fluorine containing chemical include HF, buffered HF (BOE), ammonium fluoride ($NH_4F$), ammonium bifluoride and combinations thereof. In one example, the acid solution includes HF and $NH_4F$ in deionized water. One or more buffering compounds such as a surfactant may be added based on need. The concentration of HF in the deionized water may be between about 0.05 volumetric percent and 5 volumetric percent. The concentration of $NH_4F$ in the dionized water is between about 10 volumetric percent and 50 volumetric percent. In some embodiments, the ratio of HF to $NH_4F$ (HF:$NH_4F$) in the dionized water is about 0.18 volumetric percent:24 volumetric percent. The pH value of the acid solution is controlled at less than or about 6, such as between about 2 and about 6, for example between about 3 and 5.

The fluorine containing chemical included in the acid solution is configured to provide a suitable amount of fluorine ions ($F^-$), e.g., at a desired predetermine concentration, to react with the dielectric materials from the STI region 202. In one example, the dielectric materials include silicon oxide elements. The fluorine ions react with the silicon oxide elements to form certain ammonia salts, such as $(NH_4)_2SiF_6$. The reaction mechanism to dissolve the silicon oxide insulating material in the STI region 202 into liquid is described by the following equation:

$$SiO_2 + 4HF + 2NH_4F \rightarrow (NH_4)_2SiF_6 + 2H_2O$$

The acid solution may have a solution temperature between at 10° C. and 100° C., such as around 22.5° C. The substrate 200 may be immersed in the acid solution for a time period between about 5 seconds and about 500 seconds, such as between about 10 seconds and 60 seconds.

The treatment solution may be provided in a tank, a sink, a bath, or other suitable containers. During the surface treatment process at operation 104, the treatment solution may be agitated, stirred or circulated as needed to improve process condition uniformity cross the substrate 200. Also, a mega-sonic or ultrasonic power may be applied to the treatment solution as needed to improve process efficiency.

In the embodiment where the defect 212a, 212c is formed on the diffusion region 205, which is fabricated from a silicon containing material, the treatment solution may be an alkaline solution that reacts with the materials from the diffusion region 205. The alkaline solution may include etchants having carbon based chemicals, such as tetramethylammonium hydroxide (TMAH; or $(CH_3)_4NOH$), aqueous potassium hydroxide (KOH), sodium hydroxide (NaOH), aqueous ammonia ($NH_4OH$), or other similar alkaline etchants dissolved in deionized water. Similarly, as discussed above, some buffering compounds, such as one or more pH adjusting agents, surfactant, additives or solvents, may be utilized to maintain a predetermined level of pH value and assist dissociation of the chemical compounds dissolved in the alkaline solution as described here.

In one specific example, the alkaline solution includes tetramethylammonium hydroxide (TMAH; or $(CH_3)_4NOH$) dissolved in DI water and is utilized to etch a silicon based material, e.g., crystalline silicon materials or doped silicon materials, in the diffusion region 205. The TMAH included in the alkaline solution may have a concentration between about 0.1 volumetric percent (%) and about 15 volumetric percent (%), such as about 2.38%, in deionized water. The alkaline solution may have a solution temperature between 10° C. and 100° C., such as around 25° C. The substrate 200 may be immersed in the alkaline solution for a time period between about 5 seconds and about 500 seconds. The pH value of the alkaline solution is controlled at greater than 9, such as between about 10 and about 13.5, for example between about 11 and about 13.

The reaction mechanism to dissolve the silicon based material, e.g., crystalline silicon materials or doped silicon materials, in the diffusion region 205 into liquid is described by the following equation:

$$6(CH_3)_4NOH + Si \rightarrow 6(CH_4)_4N + Si(OH)_6^{2-} + 12H_2$$

In the example shown in the enlarged view depicted in FIG. 2D$_1$, the enlarged defect 212a is enlarged in dimension by the wet process to have the second height 223 of between about 800 Å and about 1600 Å and to have a notch form.

In another example shown in the enlarged view of FIG. 2D$_2$, a combination of a dry etching process and a wet etching process is used to etch the substrate 200. The sequence for performing the dry and wet etching processes may be in any order. The dry process anisotropically etches the substrate 200 to form a substantially vertical sidewall 265 on the second tip 220a' of the defect 212a' as shown in FIG. 2D$_2$. The wet process using the alkaline solution isotropically widens and/or deepens the defect 212a' in random dimension and directions. The anisotropic etching from the dry etching process allows the defect 212a' to have a substantially vertical sidewall 265, forming substantially cubic or cylindrical microstructures in the substrate 200. The isotropic etching from the wet etching process allows the defect 212a' to have a wider dimension so as to facilitate capture and detection of the defect 212a' by the defect inspection tool.

In yet another example depicted in FIG. 2D$_3$, the alkaline solution etches the substrate 200 at certain planes in the substrate 200 to form pyramids, polygons, or textured surfaces in desired shapes with different geometric configurations. As the silicon based materials from the substrate 200 often dominantly includes crystalline planes at <111> or <100> orientations, the etchants may etch along these crystalline planes with particular orientations, thus forming self-sharpening tips, such as the second tip 220a", with sidewall planes 264 at particular angles, as shown in FIG. 2D$_3$. As a result, polygonal shaped defects 212a" may be found after the surface treatment process at operation 104 is performed, as shown in FIG. 2D$_3$. Although the defect 212a" depicted in FIG. 2D$_3$ is in pentagonal form, it is noted that the defect 212 could be polygon, pyramids, cubic, ovals, notched, square, rectangular, or other microstructures with planar, convex or concave corners, bottom and sidewalls in two and three dimensional configurations.

Figure 3:
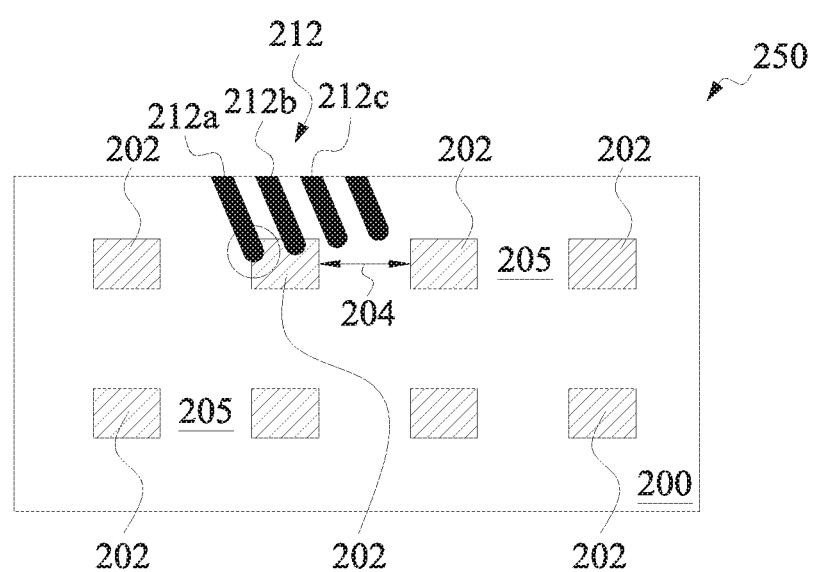
FIG. 3 depicts a top view of an embodiment of the structure at different stages of the manufacturing process depicted in FIG. 1 in accordance with some embodiments.

FIG. 3 further depicts a top view of the substrate 200 of FIG. 2C having the defects 212 formed on the substrate 200. The defects 212 depicted in FIG. 3 are in the form of micro-scratches caused by the CMP process. The defects 212 are formed both in the diffusion region 205, such as defect 212c, and the STI structure 202, such as the defect 212b, or at the interface between the diffusion region 205 and the STI structure 202, such as the defect 212a. The shallow or subtle defects 212 depicted in FIG. 3 may be exaggerated to allow detection and viewing by the defect inspection tool. However, in some cases, the defects 212 may be undetectable or not viewable at this manufacturing stage. More examples of the defects 212 detected by the defect inspection tool at later manufacturing stages will be described and discussed below with reference to FIG. 4.

At optional operation 105, several processes may be performed after the surface treatment process at operation 104 and prior to an inspection process at operation 106. Thus, the inspection process at operation 106 may be performed immediately or after one or more processing steps after the surface treatment process at operation 104. Suitable processes that may be performed between the surface treatment process at operation 104 and the inspection process at operation 106 include gate materials deposition, ion implantation process, lithographic and etching processes.

At operation 106, after the surface treatment process at operation 104 and/or the optional processes at operation 105 are completed, the inspection process is performed to inspect the conditions of the substrate 200. The inspection process may include positioning the substrate 200 under a detector for inspection. In one example, the detector includes a light source forming part of an optical microscope (OM) used to view individual device die pattern or features formed in the substrate 200. In another example, the detector is an electron microscope, such as scanning electron microscope (SEM), transmission electron microscope (TEM) or the like, or a sensor capable of detecting local surface roughness, surface topography, surface defects or surface morphology on the substrate 200. In yet another example, the detector includes a camera that can capture images of the substrate 200 so as to analyze the substrate 200 based on the image color contrast, image brightness contrast, or image comparison.

In one example, the detector linearly scans the substrate surface using a line of optical radiation across a linear region of the substrate 200 to identify the coordinate, alignment, or orientation of the substrate 200. The detector uses the data from the scan to generate a surface topography map, a die pattern map or a substrate surface defect distribution map. In one example, the detector scans the locations where the diffusion regions 205 and the STI structures 202 are formed in each device cell (or called device die) on the substrate 200 to generate a die pattern map. Other locations may also be scanned at operation 106 as reference data for comparison as needed. The generated surface topography map, die pattern map or substrate surface defect distribution map is transferred to a data computing system, such as a controller, included in the detector for analysis.

At operation 108, the data computing system analyzes the data, e.g., the surface topography map or substrate surface defect distribution map, obtained from the substrate inspection process of operation 106. In one example, the data computing system compares the data with the database library or algorithm stored in the data computing system to generate instructions to determine if the surface topography or the defect level on the substrate 200 is within the desired limit (e.g., within the engineering specifications) as programmed or stored in the data library. For example, the data computing system can determine whether the defect level of the substrate 200 is within the engineering specification.

Thus, if the data computing system determines the defect level of the substrate 200 is within the engineering specification, the process 100 is then directed to proceed to operation 112 to continue processing and manufacturing the structure on the substrate 200. Additional stages of processing and manufacturing the substrate 200 may include ion implantation process, photolithography process, deposition process or etching process.

In contrast, when the data computing system determines that the surface defect distribution map or die pattern map as detected is outside of the desired limit (e.g., out of the engineering specifications) or does not match the desired die pattern map stored or programmed in the data library, the process is then directed to proceed to operation 114. For example, if the defect distribution map or die pattern map shows the defect counts are greater than 5 percent of the defect counts from the limit as stored or programmed in the data library, the data computing system then directs the process to proceed to operation 114. Other standards, such as pattern contours, die image, or pattern image contrast, may also be utilized to determine if the surface defect distribution map or die pattern map is within or outside of the desired limit.

At operation 114, an engineer, an operator, a user, or the data computing system will determine whether the substrate 200 needs to be reworked or to be scrapped, based on the degree to which the defect level on the substrate 200 is outside the desired limit. Alternatively, an engineer, an operator, a user, or the data computing system may also determine if the process parameters of the CMP process or other associated processes may be adjusted or altered so as to reduce the likelihood of defects forming on the substrate 200. For example, process parameters that may be adjusted in a CMP process include the polishing head down force, substrate platen rotating speed or polishing fluid flow rate when micro-scratch defects are found on the substrate.

Thus, by utilizing the process 100, particularly the surface treatment process performed at operation 104, the defects of a substrate is enhanced for detection by the inspection process. Early detection enables real-time action on the substrate 200 that has defects and/or structural issues. Late detection or discovery of the defects on the substrates may result in unnecessary and/or redundant process steps performed on the substrate that is eventually scrapped or abandoned. Thus, early detection of the defects formed on the substrate may eliminate or reduce manufacturing time/cycles performed on a problematic substrate, thus saving manufacturing cost and improving product yield.

Figure 4:
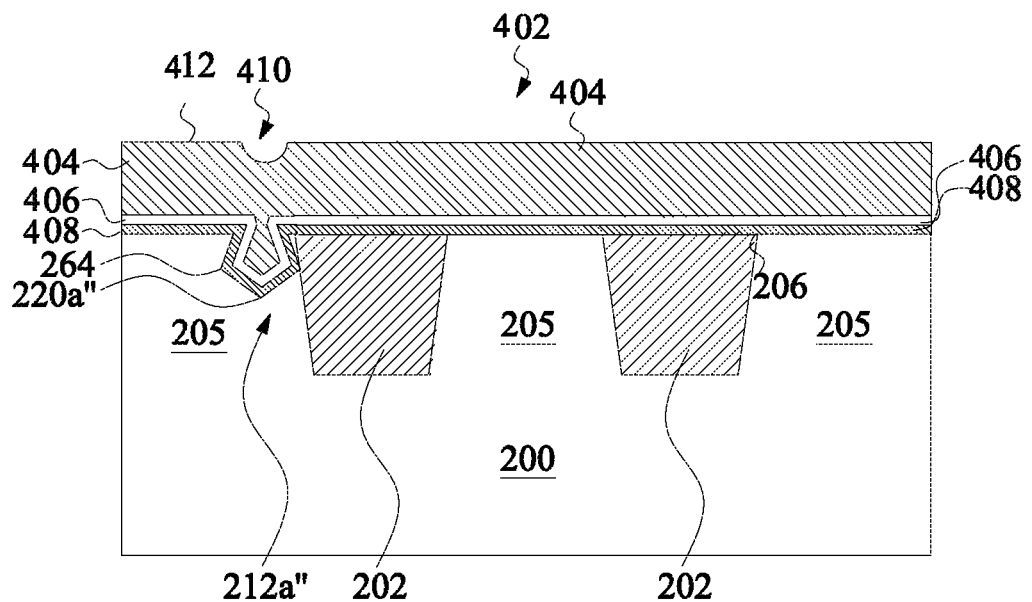
FIG. 4 depicts one embodiment of a structure formed on the substrate according to the manufacturing process depicted in FIG. 1 in accordance with some embodiments.

Furthermore, in some examples, after the defect 212 on the substrate 200 is enhanced, the enhanced defect 212 may still be subtle and not effectively detectable by the surface inspection process at operation 106. A film stack 402 subsequently formed on the enhanced defects 212 may be prone or more likely to peel, collapse or become defective due to the enlarged defect dimensions, as shown in FIG. 4. In one of the examples depicted in FIG. 4, the defect 212a'' from FIG. 2D$_3$ may cause a portion of a gate dielectric layer 408, a high dielectric constant layer 406, and a gate electrode layer 404 to collapse within the defect 212a'', resulting in enhanced defects 410, e.g., a concave structure, formed on a surface 412 of the film stack 402, which may be easily detectable by a defect inspection tool.

Figure 5:
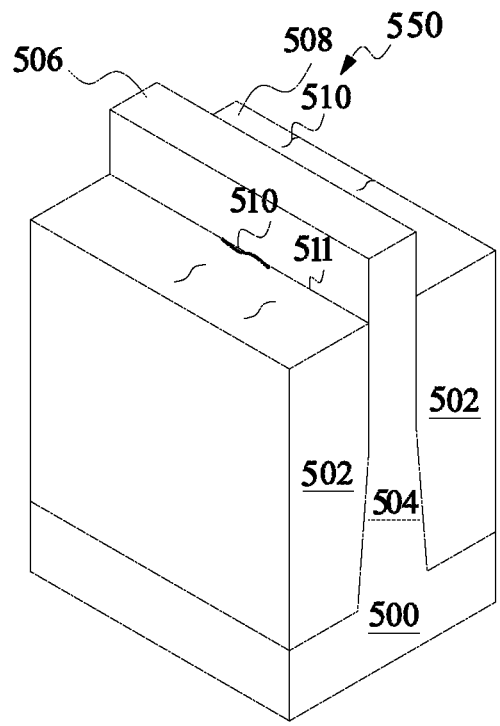
FIG. 5 depicts a perspective view of another embodiment of a substrate with composite structures at different stages of the manufacturing process depicted in FIG. 1 in accordance with some embodiments.

Although the examples described in the structures of FIGS. 2A-2D$_3$ and FIG. 3 are illustrated in a planar configuration, it is noted that the process 100 may also be performed in structures with three-dimensional configurations. For example, the process 100 may also be performed on a substrate 500 with a FINFET structure 550 formed thereon, as shown in FIG. 5. The FINFET structure 550 may include a fin structure 504 formed between STI structures 502. A surface 508 of the STI structures 502 as well as an interface 511 between the STI structure 502 and the fin structure 504 may have subtle defects 510, such as micro-scratches, formed thereon (e.g., similar to the embodiment depicted in FIGS. 2A-2D$_3$). As discussed above, the defects 510 may be caused by a CMP process performed to remove excess materials from the substrate 500 to form the STI structure 502 on the substrate 500. After the CMP process, the fin structure 504 is formed on the substrate 500 at the location similar to the diffusion region 205 described in FIGS. 2A-2D$_3$ with or without defects 510 from the CMP process. After forming the fin structure 504, the uneven topography due to a step-height of the surfaces 508, 506 from the fin structure 504 and the STI structures 502 may result in the defects 510 having an interrupted or discontinued form. Detecting or inspecting this type of defects 510 may be difficult to perform in real time. For example, an inspection may not detect the defects 510 formed on the STI structure 502 after a chemical mechanical polishing (CMP) process. As discussed above, delayed detection of such defects may result in increased manufacturing cost and lost time. Thus, a treatment process 100, particularly the surface topography enhancement process at operation 104, may be performed on the FINFET structure 550 to enlarge the defects 510. As a result, substrates having these problematic defects may be detected early in the fabrication processes so as to enable early action and decisions to be taken to solve the undesired surface conditions on a substrate.

Thus, methods for enhancing surface topography of a structure formed on a substrate are provided. The enhanced surface topography of the substrate may render defects/microstructures from the substrate to be more accurately detected and inspected. The surface topography of the substrate is enhanced by performing a surface treatment process to enlarge the defects formed on the substrate to be detectable by a defect inspection tool. The surface treatment process includes a dry etching, a wet etching, or a combination thereof to etch the substrate with different materials, so as to enlarge the defects in dimension to promote accurate and real-time defection of the defects. The dry etching process includes a plasma process, and the wet etching process includes using an acid solution to enhance defects located in dielectric material or an alkaline solution to enhance defects located in silicon containing materials in the substrate. By enlarging the defects for early detection, early action or decision may be taken and made on the problematic or defective substrates. Furthermore, a recipe, such as the process parameters from the CMP process or other processes that may have caused the defects, may be adjusted to improve the process conditions as well as minimize the likelihood of defect formation. Thus, manufacturing cycle time and cost is saved because unnecessary processes are not performed on the problematic or defective substrates, thus increasing product yield.

In one embodiment, the method includes performing a polishing process on a substrate having a shallow trench isolation structure and a diffusion region, performing a surface topography enhancing process to enlarge a defect in at least one of the shallow trench isolation structure and the diffusion region, inspecting at least one of the shallow trench isolation structure and the diffusion region to detect the enlarged defect, and adjusting a parameter of the polishing process in response to detecting the enlarged defect.

In another embodiment, a method of manufacturing a structure on a substrate includes processing a surface of a substrate, wet processing the substrate to enlarge a defect caused by processing the surface, wherein the defect is enlarged between about 20 percent and 60 percent from its original dimension, and inspecting the structure to detect the enlarged defect.

In yet another embodiment, a method for manufacturing a structure on a substrate includes performing a CMP process on a surface of a substrate having a shallow trench isolation structure and a diffusion region, wet treating the surface of the substrate to enlarge a microstructure in at least one of the shallow trench isolation structure and the diffusion region, wherein the microstructure is enlarged between about 20 percent and 60 percent from its original dimension, and inspecting at least one of the shallow trench isolation structure and the diffusion region to detect the enlarged microstructure, the enlarged microstructure has a shape selected from the group consisting of polygon, pyramids, cylinder, notch, cubic, and angled sidewalls.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of manufacturing a structure on a substrate comprising:
    performing a polishing process on a substrate having a shallow trench isolation structure and a diffusion region;
    performing a surface topography enhancing process to enlarge a defect in at least one of the shallow trench isolation structure and the diffusion region;
    inspecting at least one of the shallow trench isolation structure and the diffusion region to detect the enlarged defect; and
    adjusting a parameter of the polishing process in response to detecting the enlarged defect.

2. The method of claim 1, wherein the defect comprises at least one of micro-scratches, dishing and residuals from the polishing process.

3. The method of claim 1, further comprising:
forming a gate structure or fin structures on the diffusion region of the substrate.

4. The method of claim 1, wherein the shallow trench isolation structure is in the substrate.

5. The method of claim 1, wherein performing the surface topography enhancing process enlarges a dimension of the defect between about 20 percent and 60 percent on the surface.

6. The method of claim 5, wherein the defect is enlarged to a shape selected from the group consisting of polygon, pyramids, cylinder, notch, cubic, and angled sidewalls.

7. The method of claim 5, wherein the enlarged defect has a depth between about 800 Å and about 1600 Å.

8. The method of claim 1, wherein performing the surface topography enhancing process comprises:
    immersing the substrate in a liquid solution.

9. The method of claim 8, wherein the liquid solution is an alkaline solution when the defect is formed on a silicon containing material in the diffusion region.

10. The method of claim 9, wherein the silicon containing material is a crystalline silicon material or doped silicon material.

11. The method of claim 9, wherein the liquid solution comprises at least one of tetramethylammonium hydroxide, aqueous potassium hydroxide, sodium hydroxide and aqueous ammonia in deionized water.

12. The method of claim 8, wherein the liquid solution is an acid solution when the defect is formed on a dielectric material in the shallow trench isolation structure.

13. The method of claim 12, wherein the dielectric material is silicon oxide or oxide containing material.

14. The method of claim 12, wherein the liquid solution comprises at least one of HF, $NH_4F$, buffered HF, ammonium fluoride and ammonium bifluoride in deionized water.

15. A method for manufacturing a structure on a substrate, comprising:
    processing a surface of a substrate, the substrate including a shallow trench isolation structure and a diffusion region;
    wet processing the substrate to enlarge a defect caused by processing the surface, wherein the defect is enlarged between about 20 percent and 60 percent from its original dimension; and
    inspecting the structure to detect the enlarged defect.

16. The method of claim 15, wherein the wet processing uses an acid solution when the defect is located is in a shallow trench isolation structure fabricated from a dielectric material.

17. The method of claim 15, further comprising:
dry etching the surface of the substrate prior to or after wet processing the substrate.

18. The method of claim 15, wherein the wet processing uses an alkaline solution when the defect is located in a diffusion region fabricated from a silicon containing material.

19. The method of claim 18, wherein the silicon containing material is a crystalline silicon material or doped silicon material.

20. A method for manufacturing a structure on a substrate, comprising:
    performing a CMP process on a surface of a substrate having a shallow trench isolation structure and a diffusion region;
    wet treating the surface of the substrate to enlarge a structure selected from the group consisting of scratches, convex regions, concave regions, dishing defects and erosion defects in at least one of the shallow trench isolation structure or the diffusion region, wherein the structure is enlarged between about 20 percent and 60 percent from its original dimension; and
    inspecting the shallow trench isolation structure or the diffusion region including the enlarged structure to detect the enlarged structure, the enlarged structure having a shape selected from the group consisting of polygon, pyramids, cylinder, notch, cubic, and angled sidewalls.

* * * * *